United States Patent [19]

Avanic et al.

[11] Patent Number: 5,166,646
[45] Date of Patent: Nov. 24, 1992

[54] INTEGRATED TUNABLE RESONATORS FOR USE IN OSCILLATORS AND FILTERS

[75] Inventors: Branko Avanic, Miami; Robert L. Benenati, Tamarac, both of Fla.

[73] Assignee: Motorola, Inc., Schaumburg, Ill.

[21] Appl. No.: 832,553

[22] Filed: Feb. 7, 1992

[51] Int. Cl.$^5$ .................. H03B 5/36; H03H 9/25; H03H 9/64
[52] U.S. Cl. .................. 331/107 A; 331/108 C; 331/177 R; 333/193; 334/15; 257/312
[58] Field of Search .......... 331/108 C, 108 D, 107 A, 331/177 R, 177 V; 310/313 R; 333/187–194; 334/15; 357/51

[56] References Cited

U.S. PATENT DOCUMENTS

| | | | |
|---|---|---|---|
| 4,354,166 | 10/1982 | Grudkowski | 331/107 A |
| 4,890,370 | 1/1990 | Fukuda et al. | 310/320 |
| 4,973,922 | 11/1990 | Embree et al. | 331/108 D |
| 5,075,641 | 12/1991 | Weber et al. | 331/108 C |

Primary Examiner—Siegfried H. Grimm
Attorney, Agent, or Firm—M. Mansour Ghomeshi

[57] ABSTRACT

An integrated tunable resonator (100) includes a common semiconductor carrier (110). Formed on the common semiconductor carrier (110) is an integrated voltage variable capacitor (104). A bulk acoustic wave resonator is formed on the common semiconductor carrier (110) and coupled to the voltage variable capacitor (104). In one aspect of the present invention, a thin film resonator (106) is coupled to the voltage variable capacitor (104) both of which are formed on a common semiconductor substrate (110). The combination of these three elements provide for a tunable integrated resonator (100). In another aspect of the present invention, a surface acoustic wave resonator (522), formed on a common semiconductor carrier (514), is coupled to a voltage variable capacitor (520) in order to provide a tunable resonator (500).

20 Claims, 5 Drawing Sheets

INTEGRATED TUNABLE RESONATORS FOR USE IN OSCILLATORS AND FILTERS

TECHNICAL FIELD

This invention relates generally to resonators and more specifically to electronically tunable resonators.

BACKGROUND

In recent years, significant advances realized in the integration of electronic components has resulted in full integration of many electronic devices. A category of devices that has consistently persisted the transfer to full integration has been radio communication devices. These devices employ a variety of electronic components some fully integratable yet others not. One of the essential elements of a radio communication device is a tunable resonator which has so far not been integrated because of its tunable components. Presently, no means are available for providing a fully integratable and tunable resonator that exhibits good loss characteristics. In general, resonators are used with oscillators to provide the operating frequency of radio communication devices. Presently, integrated oscillators rely on external connections for the resonator. This is due to the fact that resonators cannot be integrated in the oscillator package primarily because of their tuning elements and loss characteristic. In the move towards fully integrated radio communication devices, it is therefore necessary to have a fully integratable and tunable resonator.

SUMMARY OF THE INVENTION

Briefly, according to the invention, an integrated tunable resonator is provided having a common semiconductor carrier. Formed on the common semiconductor carrier is an integrated voltage variable capacitor. Coupled to the voltage variable capacitor there is formed a bulk acoustic wave resonator on the semiconductor carrier. In one aspect of the present invention, a thin film resonator (TFR) is coupled to the voltage variable capacitor both of which are formed on a common semiconductor substrate. The combination of these three elements provide for a tunable integrated resonator. In another aspect of the present invention, a surface acoustic resonator, formed on the common semiconductor carrier, is coupled to the voltage variable capacitor in order to provide a tunable resonator.

DETAILED DESCRIPTION OF THE PREFERRED EMBODIMENT

In the design of tunable resonators, electronic engineers and designers have been plagued by currently available tunable components. A variety of resonators, such as surface acoustic wave (SAW) resonators are available where surface propagation of acoustic waves are generated and, via mechanical feedback, are converted back to signal, hence produce oscillation at a desired frequency. Other resonators such as Bulk Acoustic Wave (BAW) use thin film technology to provide resonance at a desired frequency. The operation of and technologies used in SAW and BAW resonators are well known in the art. These resonators are commonly used in radio communication devices in conjunction with tunable components, such as capacitors and varactors. These tunable components render the frequency of operation of the resonators tunable. Varactors, although intergratable, provide very narrow bandwidth (tunability) range which has very limited applications. Variable capacitors, on the other hand, cannot be integrated in ranges desired for use with these BAW and SAW resonators. The principles of the present invention provide for a tunable resonator which can be integrated.

Figure 1:
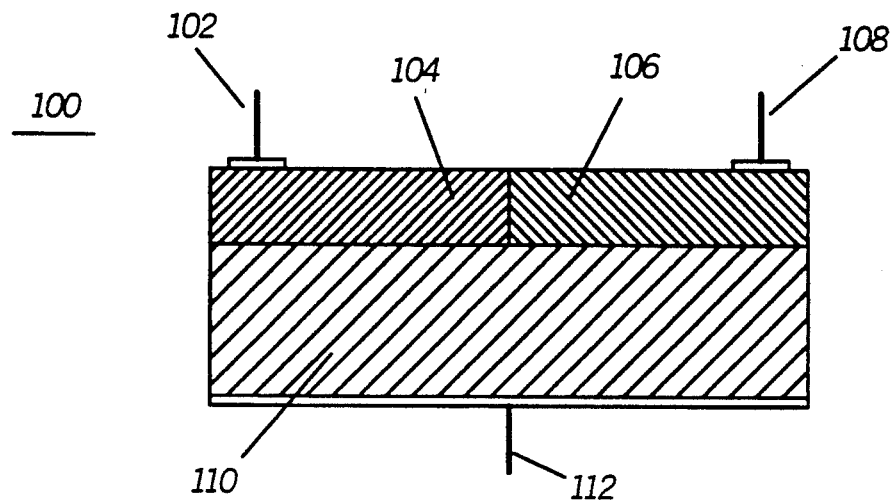
FIG. 1 shows the components of a tunable resonator in accordance with the present invention.

Referring to FIG. 1, a resonator 100 is shown employing the principles of the present invention. The resonator 100 includes a common substrate 110 coupled to a metal plate 112 providing for external contact. Formed on the common substrate 110 are two components establishing the tunable portion and the resonating portion 104 and 106, respectively. Contact plates 102 and 108 provide the additional external contact with the resonator 100. The resonator section 106 may be constructed using any of well known resonator technologies, preferably TFR. The tunable component 104 is a voltage variable capacitor (VVC) constructed in accordance with the present invention.

Figure 3:
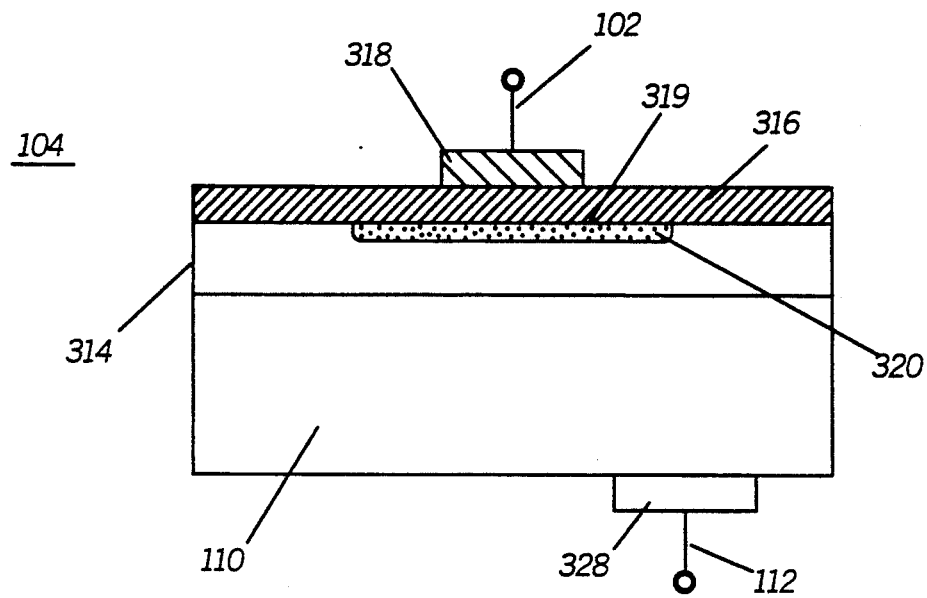
FIG. 3 shows a cross-sectional view of the a voltage variable capacitor.

A VVC is a device which exhibits a very large variation in capacitance vs. voltage. FIG. 3 shows one such capacitor in accordance with the present invention. Capacitance variation in the order of 50 to 1 can be exhibited from the low control to high control voltage with these capacitors. Due to the physical construction of the VVC, this electrical property is obtained with no appreciable current drain penalty, the currents present are only leakage currents which are in the order of nano-amperes. The dimension of the VVC is proportional to the capacitance in the low control voltage; a typical size for a 50 pico-Farad capacitance is 10×10 mils.

A VVC can be used as a discrete device or integrated as part of a much larger subcircuit (i.e., a tunable resonator). The operation of the VVC 104 will be discussed in more detail below. In general, the capacitance of the VVC 104 is controlled via a DC voltage applied to its terminals 102 and 112. As mentioned, under extreme capacitance changes, and along with appropriate accompanying components, the VVC 104 appears as a variable capacitor having a range from low to high capacitance depending on the control voltage.

Figure 2:
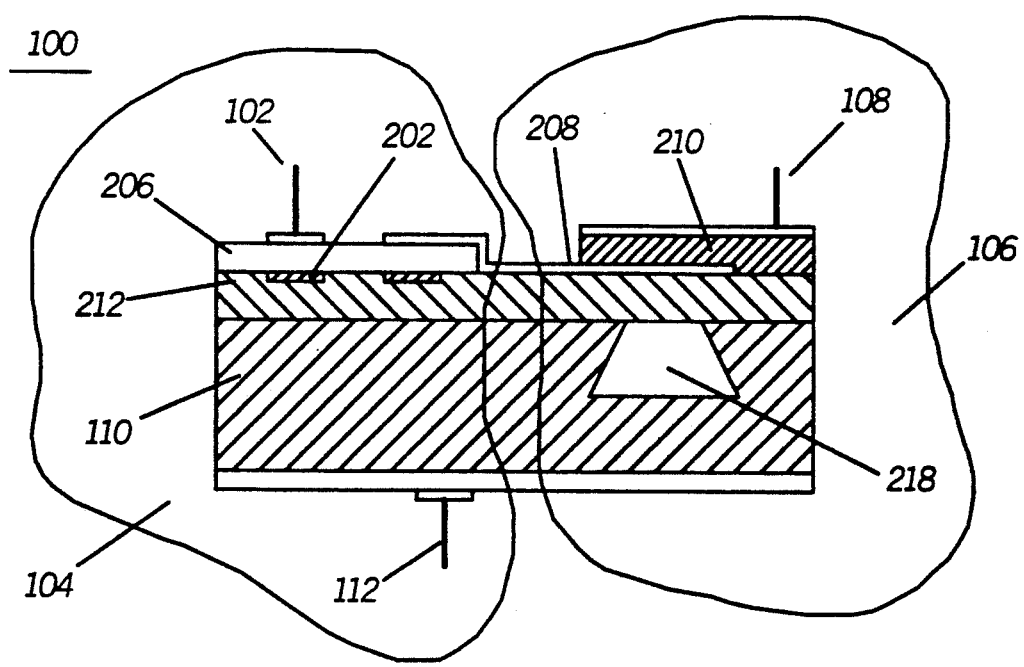
FIG. 2 shows a tunable resonator in accordance with the present invention.

Referring now to FIG. 2, a cross-sectional view of the preferred embodiment of the tunable resonator 100 is shown. The preferred embodiment uses TFR technology for the resonator section. On the resonator section 106, the contact 108 is coupled to a zinc oxide layer 210 formed on a portion of the common substrate 110. Directly underneath the zinc oxide layer 210, and in accordance with the construction of thin film resonator technology, a gap 218 is formed. A conductive plate 208 is sandwiched between a heavily doped semiconductor layer 212 and the zinc oxide layer 210. This conductive plate provides coupling between the resonator section 106 and the VVC section 104. The VVC section 104 includes an insulator layer formed on the heavily doped semiconductor layer 212. The conductive plate 208 extends from the resonator section 106 to the VVC section 104. The contact plate 102 is shown as a separate plate on the insulator layer 206. As will be explained in more detail below, a reverse bias voltage applied between terminals 102 and 112 results in the formation of a depletion region 202. The variations in the width of this depletion region 202 provide a large variation in the tuning capacitor coupled to the resonator section 106. It is this characteristic of the VVC 104 that renders the resonator 100 tunable. Furthermore, because the VVC 104 is fully integratable the integration of the entire resonator package 100 may simply be achieved.

Figure 5:
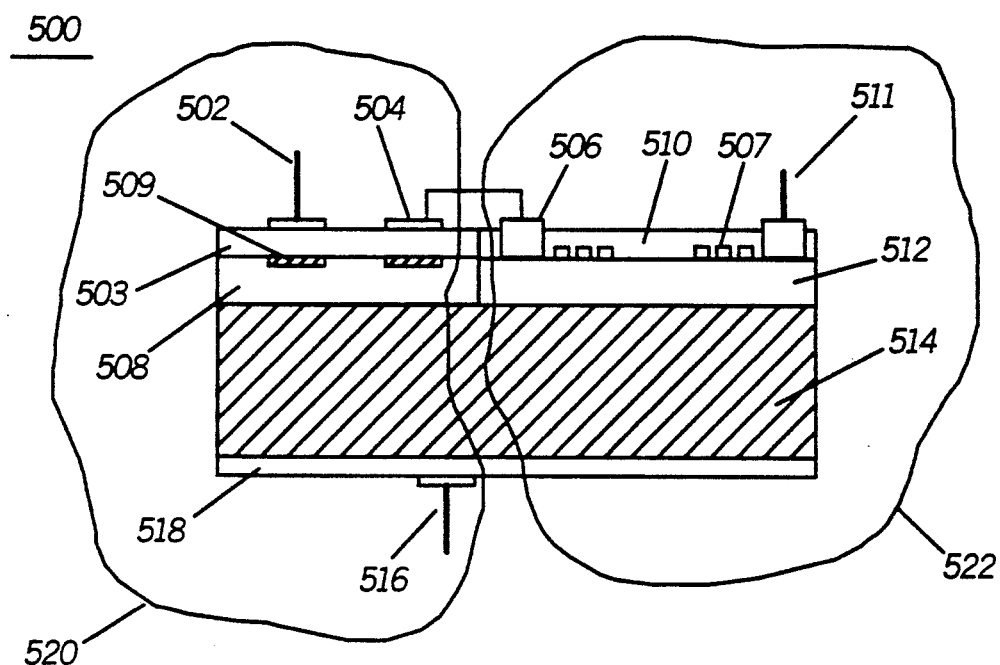
FIG. 5 shows an alternative embodiment of the tunable resonator in accordance with the present invention.

Referring to FIG. 5, an alternative embodiment of the present invention is shown. A resonator 500 includes a common substrate 514 coupled to a contact 516 via a metal layer 518. Formed on a segment of the semiconductor substrate 514 is a heavily doped semiconductor layer 508 which is used by the VVC 520 to provide capacitance tunability. An insulator layer 503 is formed on the heavily doped semiconductor layer 508 on top which an electrode 502 is formed to provide contact to the VVC structure. An insulator layer (i.e. SiO2) 512 is formed on the common substrate on the resonator section 522. A piezoelectric film 510 and a plurality of electrodes 507 are formed on the insulator layer 512 in accordance with the well known SAW technology. A contact plate 511 provides a third contact plate for the resonator 500. The coupling between the resonator section 522 and the VVC section 520 is provided via plates 504 and 506, respectively. Once again, a reverse bias voltage applied between contacts 502 and 516 forms a depletion region 509 in the heavily doped semiconductor layer 508, thereby providing tunability to the resonator 500. The variable capacitance offered via this depletion region, renders the SAW resonator 500 tunable. In other words, the operating frequency of the resonator 500 can be electronically varied by altering the reverse bias voltage on contacts 502 and 516.

Figure 7:
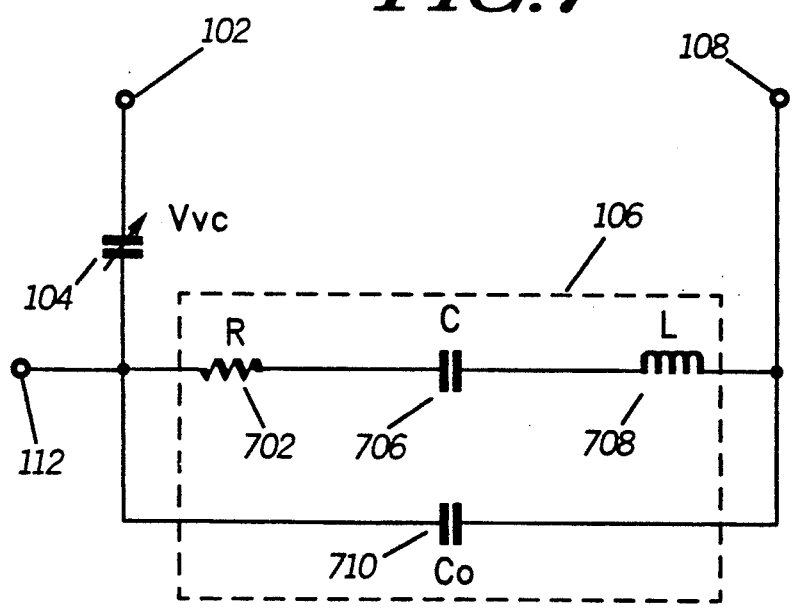
FIG. 7 is a circuit model of a tunable resonator in accordance with the present invention.

Referring to FIG. 7 a circuit model of the resonator 100 is shown in accordance with the present invention. The resonator portion 106 is shown to include a capacitor 706 in series with a resistor 702 and an inductor 708, the combination of these three elements is in parallel with a capacitor 710. The combination of these elements is a well understood circuit model of a crystal resonator. The VVC 104 is shown as a variable capacitor in series with the resonator 106. It can be seen that by varying the capacitance of the VVC 104, the operating frequency of the resonator 106 and hence the resonator 100 may be changed resulting in a tunable resonator. With this equivalent circuit, it can be seen that as the reverse biased voltage applied between 102 and 112 is varied so will the reactance of the VVC 104 and hence the operating frequency of the resonator 100.

To summarize, a voltage variable capacitor is used in conjunction with known TFR and SAW technologies to produce a tunable integratable resonator. The resonator 100 enjoys the benefits of available integratable SAW and TFR resonators with the benefits of tunability offered by a VVC. A wide variety of applications are available for this resonator. A typical example would be the use of oscillators both used for microcomputers and radio communication devices. With this integrated resonator, a giant leap is taken in overcoming a significant deficiency in the design of a fully integrated radio communication device.

The principles of the present invention find particular use in receivers which include clock operated components, i.e. controllers and micro computers. In these receivers, the harmonics of the clock frequency can creep into the receiver path and quiet the receiver, resulting in what is known as self quieting. To combat self quieting, present microcomputer circuits use switching networks to switch between crystals or oscillator configurations to provide alternative clock frequencies that would not result in self-quieting. With the resonator 100, the clock frequency may be changed electronically in tune with the receiver's operating frequency, hence eliminating self quieting.

Figure 8:
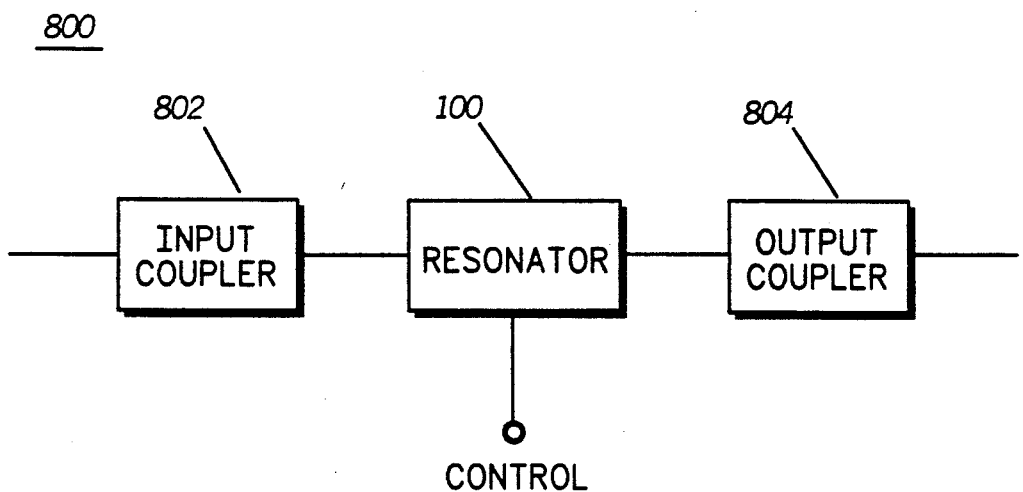
FIG. 8 shows a filter utilizing a resonator in accordance with the present invention.

The resonator 100 also finds application in filter and oscillator technologies. As the principles of the present invention have shown, the integrated resonator 100 may be tuned to different frequencies thereby providing the filter or oscillator in which it is used to have a different operating frequency. FIG. 8 is a block diagram of a filter 800 in accordance with the present invention. An input coupler 802 couples input signals to the resonator 100. The operating frequency of the filter 800 is controlled via the control input of the resonator 100. The filtered signal of the resonator 100 is coupled to the output via an output coupler 804. It is well understood that a number of resonators 100 may be combined to provide a filter with higher selectivity.

Figure 6:
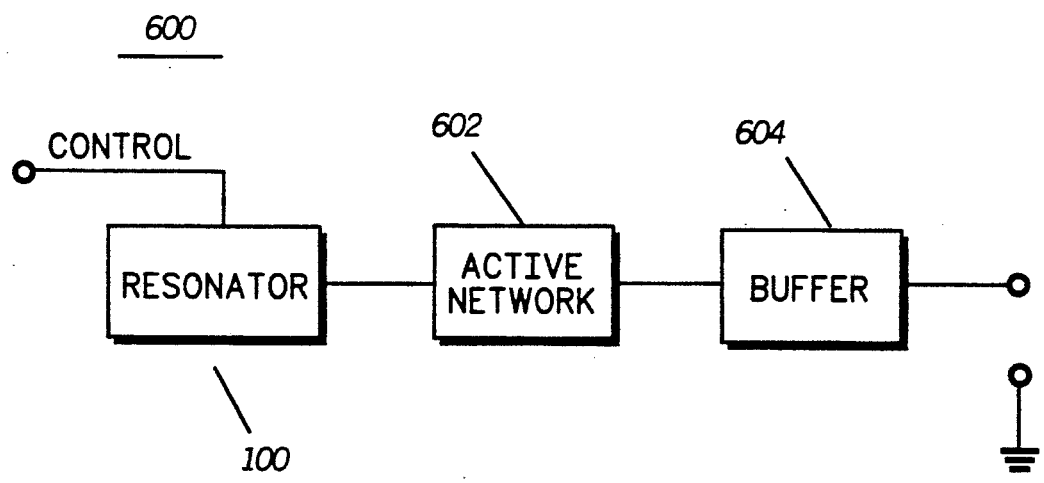
FIG. 6 shows an oscillator utilizing a resonator in accordance with the present invention.

FIG. 6 shows an oscillator circuit 600 using the resonator 100 in accordance with the present invention. The resonator 100 is shown to be coupled to an active network 602 which provides the negative resistance for the oscillator 600. The oscillation frequency of the oscillator 600 is determined via the resonator 100. The variation in the operating frequency of the resonator 100, as determined via the control signal, renders the oscillation frequency of the circuit 600 tunable. A buffer 604 couples the active network 602 to the output of the oscillator 600. It can be seen that with the use of the resonator 100 in the filter 800 and the oscillator 600 total integration of radio communication devices is no longer out of reach.

Referring now to FIG. 3, there is shown a cross-sectional view of a VVC 104 in accordance with the present invention. The construction of the VVC 104 is presented here as a model for those used in the resonators 100 and 500. The VVC 104 has two control lines, 102 and 112. An appropriate voltage applied to these control lines 102 and 112 is used to tune the VVC 104. The polarity of this voltage depends on the material used to construct the VVC 104. The VVC 104 is formed on the semiconductor substrate 110 having a surface layer 314 being less heavily doped than the substrate 110. The surface layer 314, being less heavily doped, has a higher resistivity than the semiconductor and serves as an area for a depletion layer to form. An insulator layer 316 is applied over the surface layer 314. At least one metal plate 318 is formed on the insulator layer 316. The metal plate 318 provides the external contact to the reactance component of the VVC 104 via a contact pin 102. More metal plates along with contacts may be formed on the insulator layer 316 to provide further control over the distributed capacitance of the VVC 104.

The polarity of the semiconductive material used in the fabrication of layers 110 and 314 determines the voltage polarities that will have to be applied to the control lines of the VVC. In other words, the polarity of the voltage potential applied to the control lines of devices 100 and 500 depends on the polarity of the semiconductive material used for layers 110 and 314.

The insulator layer 316 is preferably Zirconium Titanate ($ZrTiO_4$) applied in a thickness from 104 Ångstroms to 1000 Ångstroms, but thicknesses from 100 Ångstroms to 2 microns have been found to be suitable. The material employed as the dielectric or insulating layer should have a dielectric constant much greater than that of the semiconductor. Examples of suitable materials that may be used for this purpose are to be found in TABLE 1 below:

TABLE 1

| tantalum pentoxide | $Ta_2O_5$ |
|---|---|
| niobium pentoxide | $Nb_2O_5$ |
| zirconium oxide | $ZrO_2$ |
| titanium dioxide | $TiO_2$ |
| zirconium titanate | $ZrTiO_4$ |
| strontium titanate | $SrTiO_3$ |
| barium titanate | $BaTiO_3$ |
| lead titanate | $PbTiO_3$ |
| barium tetratitanate | $Ba_2TigO_{20}$ |
| barium neodymium titanate | $BaNd_2Ti_5O_{14}$ |
| lead-zirconium titanate | $Pb(Zr,Ti)O_3$ |
| lead-lanthanum zirconium titanate | $(Pb,La)(Zr,Ti)O_3$ |
| lithium niobate | $LiNbO_3$ |
| strontium-barium niobate | $(Sr,Ba)Nb_2O_6$ |

Oxides of additional elements such as molybdenum, tungsten and vanadium may also be expected to be useful, either alone or in combination with other elements.

When an appropriate reverse bias is applied between the metal electrodes 318 and 328, mobile minority charge carriers are attracted to a semiconductor insulator interface 319, forming a space-charge or depletion layer 320, which extends for some distance into the semiconductor 314. This depletion layer 320 behaves as a variable width capacitor which is electrically in series with the capacitor formed by the insulator layer 316. These two series capacitors serve to create a net capacitance effect that is affected by the changes of each individual capacitor. The electrode bias voltage controls the width of the depletion layer 320 from zero at the accumulation threshold to a maximum thickness at the inversion threshold and thereby varies the total capacitance of the device. The insulator layer 316 serves to provide the spacing between the top electrode 318 and the depletion layer 320. The depletion layer 320 is a transient layer formed when the bias voltage is applied to the capacitor through input contacts 102 and 112. The depletion layer 320, hence the distributed capacitance, may be reduced or disappear when the applied voltage field is varied or removed. Although shown in the drawing as a distinct feature, the depletion layer 320 should not be regarded as a permanent mechanical feature of the VVC 104. The operation theory described herein is similar to that found in operation of metal-oxide-semiconductor capacitors.

At the inversion threshold voltage, enough charge carriers have been attracted to the semiconductor interface such that an inversion layer is formed. Increasing the voltage bias increases the width of the inversion layer, until the layer reaches a maximum width, beyond which the depletion layer cannot be substantially increased by increasing electrode bias voltage. The maximum depletion width is determined by the concentration of the impurity dopant near the semiconductor surface onto which the insulator layer 316 has been deposited. Dopants such as phosphorous, antimony, boron and arsenic will be recognized by those skilled in the art to be useful with silicon substrates. Other semiconductor substrates, such as gallium arsenide may also be utilized to form a VVC in accordance with the invention.

The lower the doping, the larger the maximum depletion layer thickness, and thus, the lower minimum capacitance which can be achieved. The thickness of a less heavily doped surface layer may be chosen to be equal to or slightly greater than this maximum depletion width in order to minimize the series resistance of the device while maximizing the capacitance change.

Formation of an improved voltage tunable capacitor network is highly dependent upon the choice of the material comprising the insulator layer 316. By choosing a material with a much larger relative dielectric constant than the semiconductor depletion layer 320, a larger ratio of maximum-to-minimum distributed capacitance will be obtained. The larger the insulator's dielectric constant, the larger the capacitance ratio in capacitance per unit area will be for a given insulator thickness.

Many materials with very high dielectric constants have ferroelectric properties which are not desirable for high frequency devices. The polarization for a ferroelectric material has a hysteresis loop, or memory, whereby a residual polarization remains after an applied bias voltage has been removed. Thus, a residual depletion layer would also remain and thereby limit the capacitance ratio which may be obtained. These materials would be best utilized in lower frequency applications.

A low-loss, non-ferroelectric insulator layer is required for high frequency applications, specifically those for use in radio transmitting and receiving, and especially for tunable high-Q filters. Zirconium Titanate ($ZrTiO_4$) is one suitable non-ferroelectric material with a high relative dielectric constant ($K_r$ is approximately equal to 40) and low dielectric loss. By comparison, the relative dielectric constant of silicon dioxide (used in conventional MOS capacitors) is 3.9. The dielectric constant of the depletion layer in silicon is 11.7 and the dielectric constant of the depletion layer in germanium is 15.7. It can be easily seen that the dielectric constant of the zirconium titanate and the aforementioned materials in Table 1 is much larger than that of silicon dioxide. Therefore, an improved capacitor having higher capacitance ratio can be fabricated. Thin films of zirconium titanate can be formed by any of several techniques, including but not necessarily limited to, sputtering, evaporation, chemical vapor deposition, ion beam or plasma enhanced processes, sol-gel, and other solution chemistry processes. The presentation of this view is meant only to enhance the understanding of the layers involved in the construction of the VVC 104. It is not in any fashion meant to imply, directly or otherwise, a limitation on the present invention.

Figure 4:
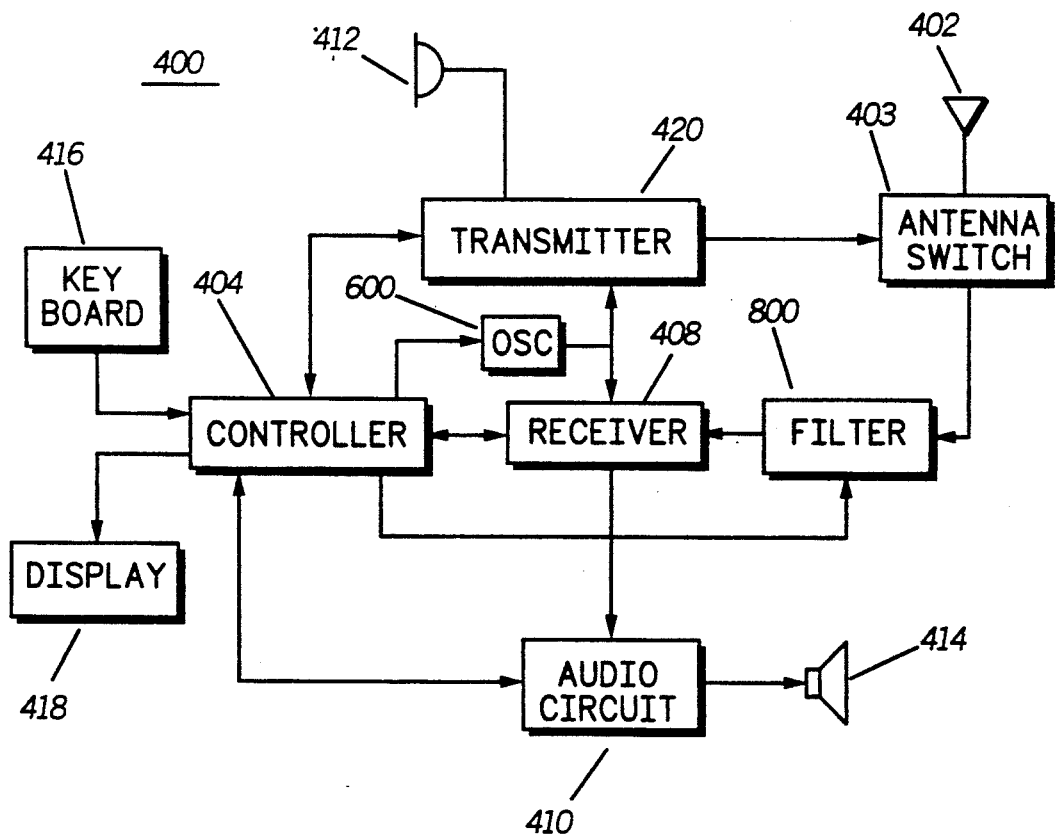
FIG. 4 shows a block diagram of a communication device in accordance with the present invention.

Referring to FIG. 4 now, a block diagram of the electrical components of a communication device 400 in accordance with the present invention is shown. The communication device 400 includes an antenna 402, a receiver 408, and a transmitter 420, both coupled to the antenna 402 via an antenna switch 403. The receiver path to the antenna switch 403 includes a filter 800 which is used to filter undesired components of the received signal before they are applied to the receiver 408. A radio frequency signal available at the antenna 402 is coupled to the input of the receiver 408 via the antenna switch 403 and the filter 800. The received radio frequency signal is recovered by the receiver 408 and coupled to the controller 404 for appropriate presentation. Data messages are decoded by the controller 404 and stored or displayed on a display 418. Voice messages are coupled to a speaker 414 via an audio circuit block 410. The audio circuit block 410 contains audio gating circuits which control the gating of audio to the speaker 414. The gating of the audio circuits is controlled by the controller 404. An oscillator 600 provides the operating frequency for the receiver 408 and the transmitter 420. As was described earlier, the oscillator 600 includes the resonator 100 whose frequency is controlled via the controller 404. The output signal of the oscillator 600 is so controlled to provide both the receive and the transmit frequencies as determined by the operating status of the communication device 400.

In the transmit mode, audio signals transduced via a microphone 412 and data signals entered via a keyboard 416 are coupled to the transmitter 420. The transmitter 420 processes these signals and prepares them for transmission via the antenna 402 through the antenna switch 403.

The ability to control the frequency of operation of the receiver 408 and the transmitter 420 renders the integration of all the elements of the communication device 400 on an integrated circuit more feasible. The predicament in fabricating a single chip receiver can now be removed by eliminating the need for discrete components that were not realizable in semiconductor devices. With the resonator 100 fully integratable it is now possible to electronically control the operation of many electronic circuits previously not possible. A significant benefit of this is the elimination of the need to design and manufacture a number of receiver assemblies to cover their desired operating frequency.

Figure 9:
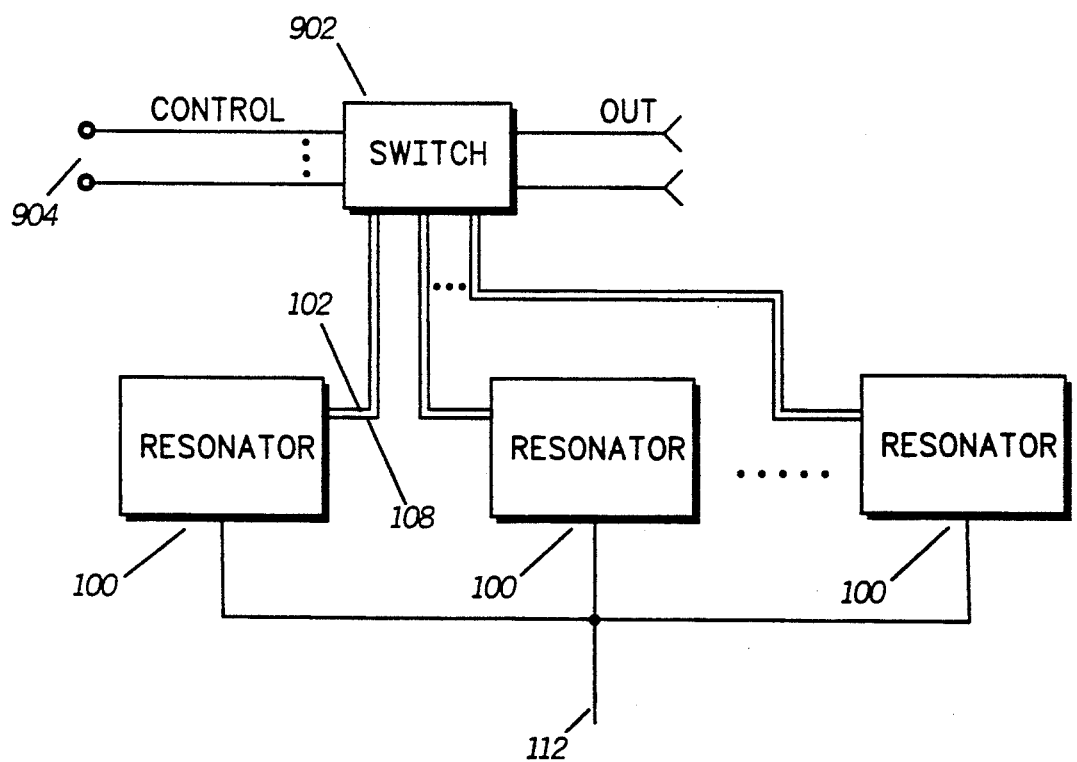
FIG. 9 is a block diagram of a wide bandwidth resonator in accordance with the present invention.

It can be demonstrated that a plurality of tunable resonators may be coupled together to form a wide bandwidth tunable resonator. Shown in FIG. 9 is one such wide bandwidth tunable resonator, in accordance with the present invention. This wide bandwidth resonator includes a number of resonators 100 coupled to a switch 902. The control lines 112 of the resonators 100 are collectively coupled to form a single control line. This single control line adjusts the capacitance of the individual VVCs 104. The signal lines 102 and 108 of the resonators 100 are coupled to the input lines of the switch 902. The position of the switch 902 is controlled via control lines 904. The number of control lines depends on the number of the individual inputs brought into the switch 902. The switch 902 is a multi-throw switch which can couple each of the resonators 100 to the output. The resonators 100 are fabricated to operate at different frequencies. The individual selection of these resonators provides the wide bandwidth resonator with a wide bandwidth. The switch 902 is also integratable in order to render the entire wide bandwidth resonator integratable. The switch 902 may be designed using FETs, PIN diodes, or VVCs.

A significant benefit of an integrated-electronically tunable resonator is that the reactance component (VVC) can be compensated for temperature, humidity, or other environmental conditions. Additional sensors can be implemented with the VVC that have the same processing variations as the VVC, rendering them significantly more accurate. This can be used to overcome the processing and environmental circuit performance variations to maintain a stable circuit performance.

Accordingly, the use of VVC in a resonator eliminates the need for discrete components opening the door to fully integratable radio communication devices. Ultra low leakage and consumption currents added to appreciable size and cost reductions along with improved large signal characteristics render this resonator 100 suitable for applications not possible with available technologies. Furthermore, it is noted that since the VVCs of the present invention do not comprise a PN junction, the non-linearities which are common with such junctions are minimized.

What is claimed is:

1. An integrated tunable resonator, comprising:
   a semiconductor carrier;
   a Bulk Acoustic Wave (BAW) resonator formed on the semiconductor carrier; and
   a Voltage Variable Capacitor (VVC) formed on the semiconductor carrier and coupled to the BAW.

2. The integrated tunable resonator of claim 1, wherein the VVC includes:
   a semiconductor having a first and a second layer, the second layer formed of semiconductive material of a higher resistivity than the first layer;
   a depletion layer formed in the second layer;
   an insulating layer formed on the second layer, said insulating layer being a metal oxide having a dielectric constant greater than the dielectric constant of the semiconductor; and
   a conductive electrode formed on the insulating layer.

3. The integrated tunable resonator of claim 1, wherein the VVC comprises a Zirconium Titanate integrated capacitor.

4. The integrated tunable resonator of claim 1, wherein the BAW comprises a Thin Film Resonator (TFR).

5. The integrated tunable resonator of claim 2, wherein the insulating layer has a dielectric constant greater than 16.

6. The integrated tunable resonator of claim 2, wherein the insulating layer is a low-loss, non-ferroelectric insulator.

7. The integrated tunable resonator of claim 2, wherein the dielectric constant of the insulating layer is greater than the dielectric constant of the second layer of semiconductive material.

8. The integrated tunable resonator of claim 2, wherein the insulating layer material is a metal oxide wherein the metal comprises at least first and second components selected from the group consisting of barium, lead, lithium, molybdenum, neodymium, niobium, strontium, tantalum, titanium, tungsten, vanadium, and zirconium.

9. An integrated tunable resonator, comprising:
   a semiconductor carrier;
   an integrated Voltage Variable Capacitor (VVC) formed on the semiconductor carrier;
   a Surface Acoustic Wave (SAW) resonator formed on the semiconductor substrate and coupled to the integrated VVC.

10. The integrated tunable resonator of claim 9, wherein the integrated VVC includes:

a semiconductor having a first and a second layer, the second layer formed of semiconductive material of a higher resistivity than the first layer;

a depletion layer formed in the second layer;

an insulating layer formed on the second layer, said insulating layer being a metal oxide having a dielectric constant greater than the dielectric constant of the semiconductor; and a conductive electrode formed on the insulating layer.

11. An integrated oscillator, comprising:

an active network;

an integrated tunable resonator coupled to the active network, comprising:

a semiconductor carrier;

a Bulk Acoustic Wave (BAW) resonator formed on the semiconductor carrier; and a Voltage Variable Capacitor (VVC) formed on the semiconductor carrier and coupled to the BAW.

12. The integrated oscillator of claim 11, wherein the BAW comprises a Thin Film Resonator (TFR).

13. The integrated oscillator of claim 11, wherein the VVC includes:

a semiconductor having a first and a second layer, the second layer formed of semiconductive material of a higher resistivity than the first layer;

a depletion layer formed in the high resistivity layer;

an insulating layer formed on the high resistivity layer, said insulating layer being a metal oxide having a dielectric constant greater than the dielectric constant of the semiconductor; and a conductive electrode formed on the insulating layer.

14. An integrated filter, comprising:

an integrated tunable resonator, comprising:

a semiconductor carrier;

a Bulk Acoustic Wave (BAW) resonator formed on the semiconductor carrier; and a Voltage Variable Capacitor (VVC) formed on the semiconductor carrier and coupled to the BAW.

15. The integrated filter of claim 14, wherein the BAW comprises a Thin Film Resonator (TFR).

16. The integrated filter of claim 14, wherein the integrated capacitor includes:

a semiconductor having a first and a second layer, the second layer formed of semiconductive material of a higher resistivity than the first layer;

a depletion layer formed in the second layer;

an insulating layer formed on the second layer, said insulating layer being a metal oxide having a dielectric constant greater than the dielectric constant of the semiconductor; and a conductive electrode formed on the insulating layer.

17. A wide bandwidth tunable resonator, comprising:

a plurality of integrated tunable resonators, the tunable resonator including:

a semiconductor carrier;

a Bulk Acoustic Wave (BAW) resonator formed on the semiconductor carrier; and a Voltage Variable Capacitor (VVC) formed on the semiconductor carrier and coupled to the BAW to provide tunability to the integrated tunable resonator; and at least one integrated switch to switch among the plurality of integrated tunable resonators.

18. The wide bandwidth tunable resonator of claim 17, wherein the at least one integrated switch includes a VVC.

19. The wide bandwidth tunable resonator of claim 17, wherein the at least one integrated switch includes a Field Effect Transistor (FET) switch.

20. The wide bandwidth tunable resonator of claim 17, wherein the at least one integrated switch includes a PIN diode switch.

* * * * *